United States Patent
Best et al.

(10) Patent No.: US 7,276,137 B2
(45) Date of Patent: Oct. 2, 2007

(54) TEXTILE PRODUCT HAVING AN INTEGRATED SENSOR FOR MEASURING PRESSURE AND TEMPERATURE

(75) Inventors: Walter Best, Duren (DE); Sebastian Gerundt, Eschweiler (DE)

(73) Assignee: Heimbach GmbH & Co. (DE)

( * ) Notice: Subject to any disclaimer, the term of this patent is extended or adjusted under 35 U.S.C. 154(b) by 378 days.

(21) Appl. No.: 10/917,529

(22) Filed: Aug. 13, 2004

(65) Prior Publication Data

US 2005/0109587 A1   May 26, 2005

(30) Foreign Application Priority Data

Aug. 13, 2003   (EP) .................. 03018343

(51) Int. Cl.
- D21F 7/06 (2006.01)
- D21F 1/30 (2006.01)
- D21F 1/10 (2006.01)
- D21F 7/08 (2006.01)

(52) U.S. Cl. ............ 162/198; 162/263; 162/348; 162/358.2; 162/900; 162/902; 162/903

(58) Field of Classification Search ............... 162/198, 162/199, 262, 263, 255, 272, 358.1, 358.3, 162/900–904, 348, 358.2, 358.4, 252; 700/127–129, 700/122
See application file for complete search history.

(56) References Cited

U.S. PATENT DOCUMENTS

| 3,798,474 A | 3/1974 | Cassand et al. |
| 4,303,733 A | 12/1981 | Bulle et al. |
| 4,568,851 A | 2/1986 | Soni et al. |
| 4,824,107 A | 4/1989 | French |
| 6,752,908 B2 * | 6/2004 | Gustafson et al. ....... 162/358.3 |
| 2002/0179270 A1 | 12/2002 | Gustafson et al. |

FOREIGN PATENT DOCUMENTS

| DE | 43 11 402 | | 10/1993 |
| DE | 37 35 709 | | 9/1995 |
| EP | 0 146 272 | * | 6/1985 |
| EP | 0 317 457 | * | 5/1989 |
| EP | 0 538 221 A2 | | 4/1993 |
| EP | 1 035 251 A1 | | 9/2000 |
| JP | 2002-203996 | * | 7/2002 |
| WO | WO 93/21378 | | 10/1993 |
| WO | WO 00/01303 | | 1/2000 |
| WO | WO 03/035976 | * | 5/2003 |

* cited by examiner

Primary Examiner—Eric Hug
(74) Attorney, Agent, or Firm—Berenato, White & Stavish

(57) ABSTRACT

The invention concerns a textile product (6) for use in a paper machine, having a monofilament or a profiled structure as support element (1) on which is arranged a layered sensor for measuring pressure and/or temperature, and is characterized in that the sensor is constituted from at least three layers (2, 3, 4), the second layer (3) having piezoelectric properties and the layers (2, 4) in contact against the second layer (3) forming electrodes that are couplable or coupled to an analysis device.

The invention further concerns a method for producing such a textile product.

22 Claims, 1 Drawing Sheet

TEXTILE PRODUCT HAVING AN INTEGRATED SENSOR FOR MEASURING PRESSURE AND TEMPERATURE

CROSS-REFERENCE TO RELATED APPLICATIONS AND CLAIM TO PRIORITY

This application claims the benefit of application number 03 018 343.8, filed Aug. 13, 2003, in the European Patent Office, the disclosure of which is incorporated herein by reference.

FIELD OF THE INVENTION

The invention concerns a textile product for use in a paper machine, having a monofilament or a profiled structure as support element on which is arranged a layered sensor for measuring pressure and temperature, as well as a method for producing a support element for a textile product.

BACKGROUND OF THE INVENTION

A textile product of this kind is known, for example, from U.S. Pat. No. 6,158,576. The known textile product comprises in its matrix a sensor that is excited by means of Nd:YAG laser radiation and as a result emits radiation having a wavelength different from the excitation wavelength. This radiation is detected by means of a detector in the vicinity of the textile product, thus making it possible, by means of the intensity and amplitude of the wavelength of the radiation emitted by the sensor, to ascertain information such as, for example, the speed or temperature of the textile product.

A principal disadvantage of this arrangement may be seen in the fact that the individual components, such as the Nd:YAG laser, detector, and analysis computer, are very cost-intensive. In addition, the individual components require a great deal of space, and their arrangement with respect to one another is relatively inflexible. Measurement can thus be performed only at specific measurement points, so that certain regions of the textile product cannot be reached by the specified measurement arrangement.

The document WO 93/21378 discloses a non-contact measurement method by induction. An electrically conductive or magnetizable metal strip is woven for this purpose into the textile product. Measurement serves to define the position of the textile product in the paper machine, and is accomplished by means of two detectors between which the textile product passes.

The disadvantage of a limited number of measurement points and the inaccessibility of specific process regions exists here as well. In addition, only positioning errors of the textile product in the paper machine can be detected by means of this measurement assemblage. It is not possible to measure the speed, pressure, or temperature of the textile product.

The document DE 43 11 402 A1 discloses a measurement apparatus, arranged outside a paper machine felt, for measuring the temperature and water permeability of the paper machine felt. The measurement apparatus comprises, for that purpose, a microwave head that is connected to a vacuum source. The measurement head is placed onto the felt, and the felt is aspirated against the measurement head by means of a vacuum source. A temperature transducer in the measurement head measures the temperature of the air and water that are sucked in. At the same time, the quantity of water pulled out of the felt is determined by means of a microwave radiator located in the measurement head. The temperature measurement allows uniform propagation of the press section's dewatering energy over the web, and also over the felt, to be tracked.

The disadvantage of this measurement apparatus is on the one hand that the measurement head must be placed onto the textile product or paper machine felt. On the other hand, the configuration of the measurement head, with a microwave radiator to measure the quantity of water in the felt and a temperature sensor to measure the temperature of the air sucked through the measurement head into the air conduit, is very complex and cost-intensive. The number of measurement points is moreover limited, both in structural terms and for cost reasons.

SUMMARY OF THE INVENTION

It is the object of the present invention to make available a textile product that enables space-saving and economical measurement at any number of measurement points within the textile product.

According to the present invention, this object is achieved in that the sensor is constituted from at least three layers, the second layer having piezoelectric properties and the layers in contact against the second layer forming electrodes that are couplable or coupled to an analysis device.

The piezoelectric layer forms, with the two electrodes, a system that can measure temperature and pressure as well as changes or differences in the latter; the reason is that in the context of a pressure or temperature load, a charge transfer occurs in the piezoelectric layer, causing the release of electrons that in turn are taken up by the electrodes and are conveyed in the form of an electrical signal to an electronic circuit of the analysis device.

In order to make application of the second layer of the sensor as simple as possible, the second layer advantageously comprises a lacquer made up of a polyvinylidene fluoride copolymer having a film thickness of 10 µm to 50 µm. It is polarized in order to achieve the aforesaid properties.

For the measurement of static and dynamic loads, one or both of the layers in contact against the second layer can be interrupted in certain segments, such that where only one of the layers is interrupted, the other continues to function as the ground electrode. If both electrodes are interrupted, the following configuration should be implemented. Firstly, one measurement field should be implemented on the support element by way of the layer combination of first metallizations, piezo lacquer, second metallization, insulating lacquer layer. The interruption can be achieved by partial omission of one or both of the metallization layers, resulting in the layer sequence metallization, piezo lacquer, insulating lacquer layer or piezo lacquer, insulating lacquer layer in the region of the interruption. Arranged adjacently to this is a further measurement field having the same layer sequence as the aforesaid first measurement field. With a sensor configuration of this kind, the electrical charge transfer occurring at the piezoelectric layer can be determined by way of an ideal voltage measurement. Both static and dynamic measurements are possible in this fashion.

If the electrons released in the context of the charge transfer are simultaneously to be used as a current supply for the sensor and/or the analysis device, a dynamic pressure or temperature load must be present. With a static load, except for the electrons released at the first charge transfer no further electrons are released that might supply energy to the sensor or the analysis device. With a dynamic load, on the other hand, charge transfers are produced at each change in load, thus releasing electrons that can be used to supply current to the analysis device, especially if the latter is arranged on the support element.

In order to protect the sensor and the outer metallization layer, for example, from short circuits resulting from water, a further layer in the form of an electrically insulating and/or moisture-insulating layer is advantageously applied on the support element.

In order to reduce still further the installation space required, it is useful to arrange the analysis electronics, in addition to the sensor, on the support element. This arrangement not only reduces the installation space; in addition, depending on the analysis device selected, it is possible to perform a measurement of pressure and/or temperature at any point in time, at any desired location of the textile product in which a support element equipped with the sensor is arranged.

The support element that is contained in the textile product is a twisted or untwisted monofilament or an extruded profiled structure that is extruded, in particular, in the form of strips. Profiled structures of this kind are disclosed, for example, in DE 37 35 709 and in EP 1 035 251. The small dimensions thus obtained allow easy arrangement of the support element in or on a textile product, for example by weaving into a woven fabric or by insertion into a yarn layer or a knitted fabric. The support element can have a round, flat, or rectangular cross section. The textile processability of the support element is retained in this context, so that the support element, with the integrated pressure/temperature sensor and analysis device including current supply, can easily be incorporated or woven into the textile product as desired in both the longitudinal and the transverse direction. The textile product can be made up, for example, of a felt into which the support element is woven, or of a combination of support elements equipped and not equipped with sensor layers, which elements can, for example, be interwoven with one another. The segmentation of the coatings allows signals to be detected in a manner referred exactly to a region. If the temperature is almost constant, applications of pressure onto the layers generate an electrical signal, correlated with the magnitude of the pressure, that can be analyzed as a measured signal. If the pressure remains almost constant in certain regions, any temperature changes cause an electrical signal, correlated with the magnitude of the temperature, that is usable as a measured signal.

The variable incorporation of the support element into the textile product in the longitudinal and/or transverse direction makes it possible to position the support element in the textile product in accordance with the load that is to be determined. The sensor layers can surround the surface of the support element entirely or only partially.

The analysis device can advantageously encompass a signal processing electronics system and/or transmission electronics system. The signal processing electronics system can preferably be constituted using transistors made of organic semiconductors, since these maintain the textile character of the textile product. Transistors manufactured with known semiconductor technology can also be used.

The transmission electronics system can be implemented by means of RFID technology or by means of SW components. RFID (radio frequency identification) technology involves non-contact data transmission on the physical basis of alternating electromagnetic fields. The RFID tags used in this context can be read, without line-of-sight connection, by a computer-controlled unit (reader). The range is on the order of up to 1 meter. To allow the information stored on the integrated chip to be read, the reader emits an electromagnetic frequency field that is received by a miniature antenna on the RFID tag. Stored data can be read, processed, and (if necessary) modified via the wireless connection. The integrated microchip, more accurately called a transponder, is supplied with energy by the radio-frequency field of the reader and therefore needs no energy source of its own.

SW components are special microacoustic elements and comprise a piezoelectric substrate on whose polished surface are applied metallic structures such as interdigital converters or reflectors. When an alternating voltage is applied to a converter, the voltage is converted by way of the inverse piezo effect into a periodic deformation of the crystal surface. This deformation propagates as an acoustic surface wave (SW). SW transponders require neither wiring or batteries. They are also small, robust, inexpensive, and extremely durable. They withstand, for example, hard radiation, high temperatures, or shock. They are therefore ideal for use at inaccessible locations such as moving or rotating parts. Transmission of the sensor signals can thus be accomplished by radio, thereby making possible even more flexible configuration of the arrangement of the reading electronics system outside the textile product. The static and dynamic measurement of pressure and/or temperature can be read out by means of ideal voltage measurement, inter alia.

BRIEF DESCRIPTION OF THE FIGURES

Advantageous embodiments of the invention are disclosed in the dependent claims and in the description of the Figures that follows. In the Figures:

DETAILED DESCRIPTION OF THE PREFERRED EMBODIMENT(S)

Figure 1:
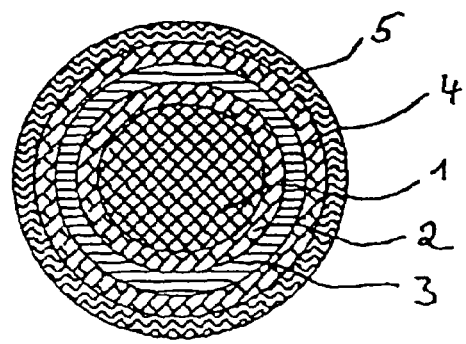
FIG. 1 is a cross section through a support element surrounded by a sensor according to the present invention.

FIG. 1 is a cross section through a textile product according to the present invention, which in this case is embodied as a support element 1 in the form of a monofilament that is completely surrounded by a first metallization 2. Applied onto this first metallization 2 is a second layer 3 having piezoelectric properties. This is a piezo lacquer comprising a polyvinylidene fluoride copolymer that can be sprayed on or otherwise applied. This layer 3 is then polarized, and a second metallization layer 4 is applied. An insulation layer 5 in the form of a lacquer, in contact against second metallization layer 4, serves to protect metallization layer 4 located below it from functional impairments and damage during operation.

Figure 2:
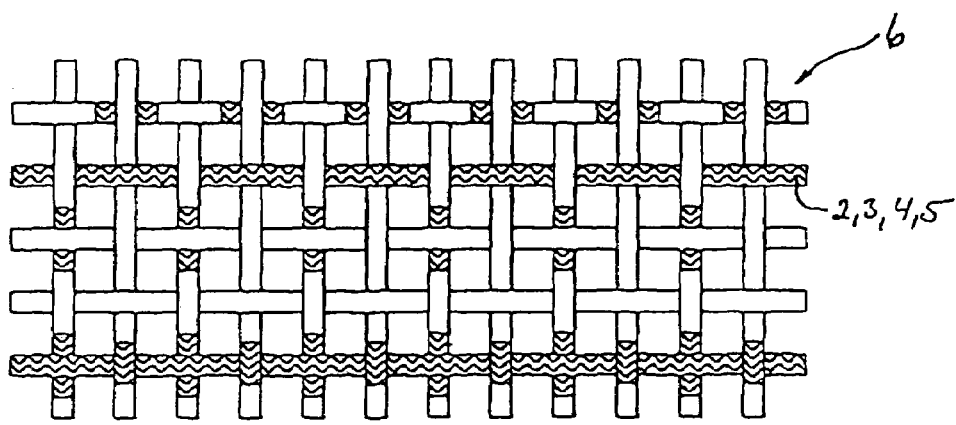
FIG. 2 shows a textile product in the form of a dryer fabric, having a support element that is entirely or partially surrounded by the sensor according to the present invention.

FIG. 2 shows, by way of example, one possible arrangement of support element 1 with sensor layers 2, 3, 4, 5 in a dryer fabric 6. Pressure plays a subordinate role in dryer fabrics 6, i.e. it is substantially constant. The temperature or temperature difference present in dryer fabric 6 is, however, important. By means of sensor layers 2, 3, 4, 5 in accordance with the embodiment described above, the temperature and temperature difference (if any) over the width of the paper web during the drying process can be measured, and any machine faults can thus be discovered in timely fashion.

When pressure stress is applied to dryer fabric 6, electrical charges are transferred in second layer 3, which has piezoelectric properties. The electrons released in this context can be taken up by the respective electrode 2 or 4 and conveyed to an analysis device (not depicted).

Figure 3:
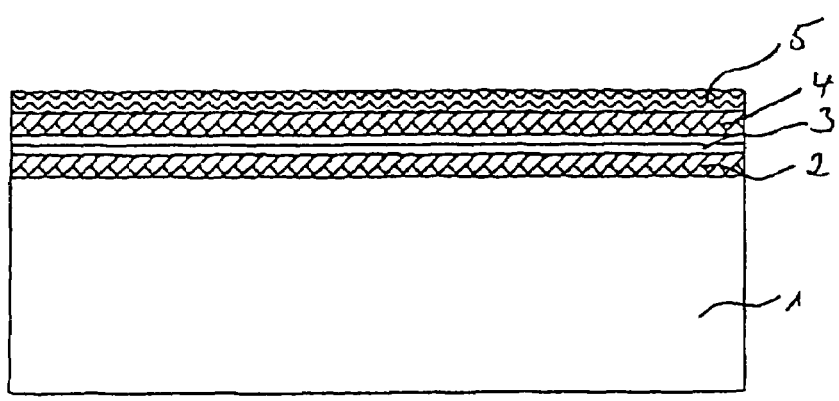
FIG. 3 is a longitudinal section through a support element on one side of which the sensor according to the present invention is arranged.

FIG. 3 is a longitudinal section through a support element 1 coated on one side with a sensor according to the present invention. Support element 1 is embodied as a flat monofilament on one of whose sides is arranged a metallization 2 onto which a polarized lacquer layer 3 having piezoelectric properties is applied. Applied onto this lacquer layer 3 is a further metallization layer 4 that is protected by an insulation layer 5 from external operation-related damage.

We claim:

1. A paper machine band comprising a textile product having at least one monofilament or profile element on which is arranged a layered sensor for measuring pressure and/or temperature, wherein the sensor is constituted from at least three layers arranged on the monofilament or profile element, the second layer having piezoelectric properties and the layers in contact against the second layer forming electrodes that are couplable or coupled to an analysis device.

2. The paper machine band as defined in claim 1, wherein the second layer is polarized.

3. The paper machine band as defined in claim 1 wherein the thickness of the second layer is 10 µm to 50 µm.

4. The paper machine band as defined in claim 1, wherein the second layer is constituted from a polyvinylidene fluoride copolymer.

5. The paper machine band as defined in claim 1, wherein the layers in contact against the second layer are constituted by surface metallization.

6. The paper machine band as defined in claim 1, wherein one or both of the layers in contact against the second layer are omitted in one or more regions to form a plurality of electrode segments in contact with the second layer.

7. The paper machine band as defined in claim 6, wherein where only one of the layers is interrupted, the other continues to function as the ground electrode.

8. The paper machine band as defined in claim 1, wherein a further layer in the form of an electrically insulating and/or moisture-insulating layer is arranged on the monofilament or profile element.

9. The paper machine band as defined in claim 1, wherein an analysis device is arranged, in addition to the sensor, on the monofilament or profile element.

10. The paper machine band as defined in claim 1, wherein in a context of dynamic loading, the analysis device is operable by way of the current generated at the sensor.

11. The paper machine band as defined in claim 1, wherein the profile element is extruded in the form of strips.

12. The paper machine band as defined in claim 1, wherein the monofilament or profile element has a round, flat, or rectangular cross section.

13. The paper machine band as defined in claim 1, wherein the monofilament or profile element is incorporated in the longitudinal and/or transverse direction of the textile product.

14. The paper machine band as defined in claim 1, wherein the sensor layers at least partially surround the surface of monofilament or profile element.

15. The paper machine band as defined in claim 1, wherein the analysis device encompasses a signal processing electronics system and/or transmission electronics system.

16. The paper machine band as defined in claim 15, wherein the signal processing electronics system comprises at least one transistor having an organic semiconductor, or one transistor manufactured by means of semiconductor technology.

17. The paper machine band as defined in claim 15, wherein the transmission electronics system is embodied as an RFID tag or SW component.

18. The paper machine band as defined in claim 1, wherein the static and dynamic measurement of pressure and/or temperature is read out by means of ideal voltage measurement.

19. A method for producing a paper machine band as defined in claim 1, wherein in a first step a metallization layer is arranged on a monofilament or profile element of the textile product, in a further step there is arranged above the metallization layer a lacquer layer having piezoelectric properties that is polarized in a next step, and in a further step a further metallization layer is arranged above the layer having piezoelectric properties.

20. The method as defined in claim 19, wherein in a further step, an electrically insulating and/or moisture-insulating layer is arranged on the monofilament or profile element.

21. The method as defined in claim 19, wherein in a further step, an analysis electronics system is additionally arranged on the monofilament or profile element.

22. The method of monitoring a preselected parameter of a paper machine clothing operating in a paper-making machine, comprising the steps of:
   a) providing a paper machine clothing having a piezoelectric sensor incorporated into the clothing, the sensor including a wireless transmitter;
   b) operating the clothing in a paper-making machine and thereby subjecting the clothing to a load acting upon the sensor;
   c) sensing with the sensor in response to the applied load the preselected parameter;
   d) transmitting with the transmitter a signal indicative of the preselected parameter; and
   e) analyzing the signal and thereby monitoring the preselected parameter.

* * * * *